United States Patent
Hidaka

(10) Patent No.: US 9,520,560 B2
(45) Date of Patent: Dec. 13, 2016

(54) SEMICONDUCTOR DEVICE AND MANUFACTURING METHOD THEREOF

(71) Applicant: KABUSHIKI KAISHA TOSHIBA, Minato-Ku, Tokyo (JP)

(72) Inventor: Aoi Hidaka, Yokkaichi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 116 days.

(21) Appl. No.: 14/444,653

(22) Filed: Jul. 28, 2014

(65) Prior Publication Data

US 2015/0349247 A1     Dec. 3, 2015

Related U.S. Application Data

(60) Provisional application No. 62/006,559, filed on Jun. 2, 2014.

(51) Int. Cl.
*H01L 47/00* (2006.01)
*H01L 45/00* (2006.01)

(52) U.S. Cl.
CPC ............. *H01L 45/16* (2013.01); *H01L 45/065* (2013.01); *H01L 45/1233* (2013.01); *H01L 45/1253* (2013.01); *H01L 45/144* (2013.01)

(58) Field of Classification Search
USPC ........ 257/2, 4, E21.35, 3; 438/135, 102, 95; 365/148
See application file for complete search history.

(56) References Cited

U.S. PATENT DOCUMENTS

| | | | |
|---|---|---|---|
| 7,994,034 B2 | 8/2011 | Fournier et al. | |
| 8,012,790 B2 | 9/2011 | Breitwisch et al. | |
| 8,409,961 B2 * | 4/2013 | Sugawara | H01L 21/76862 257/E21.001 |
| 8,803,119 B2 * | 8/2014 | Morikawa | H01L 45/144 257/2 |
| 9,177,640 B2 * | 11/2015 | Shintani | G11C 13/0004 |
| 2011/0124175 A1 * | 5/2011 | Sugawara | H01L 21/76862 438/382 |
| 2013/0221310 A1 | 8/2013 | Morikawa et al. | |

* cited by examiner

*Primary Examiner* — Telly Green
(74) *Attorney, Agent, or Firm* — Holtz, Holtz & Volek PC

(57) ABSTRACT

A semiconductor device according to an embodiment comprises a base layer. A material layer is provided on the base layer. A lower layer portion is provided in lower parts of trenches or holes formed in the material layer and has a crystal structure in a direction not perpendicular to a surface of the base layer. An upper layer portion is provided on the lower layer portion in the trenches or the holes and has a crystal structure in a direction substantially perpendicular to the surface of the base layer.

12 Claims, 5 Drawing Sheets

SEMICONDUCTOR DEVICE AND MANUFACTURING METHOD THEREOF

CROSS REFERENCE TO RELATED APPLICATIONS

This application is based upon and claims the benefit of priority from the prior U.S. Provisional Patent Application No. 62/006,559 filed on Jun. 2, 2014, the entire contents of which are incorporated herein by reference.

FIELD

The embodiments of the present invention relate to a semiconductor device and a manufacturing method thereof.

BACKGROUND

In a semiconductor storage device such as an iPCM (interfacial Phase-Change Memory), a memory layer of a storage element is formed on a lower electrode in some cases. In these cases, if the crystal state and the flatness (morphology) of a surface of the lower electrode are poor, the crystallinity (crystal structure) of the memory layer on the lower electrode is deteriorated.

For example, a memory layer of the iPCM is formed by stacking a plurality of recording layers on a lower electrode. Because the lowermost recording layer deposited first on the lower electrode functions as a seed layer for other recording layers, the crystallinity of the lowermost recording layer influences the crystallinities of the other recording layers. Therefore, the crystallinity of the lowermost recording layer is an important factor to define the property of the memory. The crystallinity of the lowermost recording layer depends on the crystal state and the flatness of a surface of the lower electrode located thereunder. That is, when the crystal state and the flatness of the surface of the lower electrode are poor, the crystallinity of the lowermost recording layer also becomes poor. Therefore, to obtain a memory with a good property, a lower electrode having a favorable crystal state and being flat is demanded.

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a substrate on which semiconductor elements are provided is assumed as "an upper direction". Therefore, the term "upper direction" or "lower direction" occasionally differs from an upper direction or a lower direction based on a gravitational acceleration direction.

A semiconductor device according to an embodiment comprises a base layer. A material layer is provided on the base layer. A lower layer portion is provided in lower parts of trenches or holes formed in the material layer and has a crystal structure in a direction not perpendicular to a surface of the base layer. An upper layer portion is provided on the lower layer portion in the trenches or the holes and has a crystal structure in a direction substantially perpendicular to the surface of the base layer.

Figure 1:
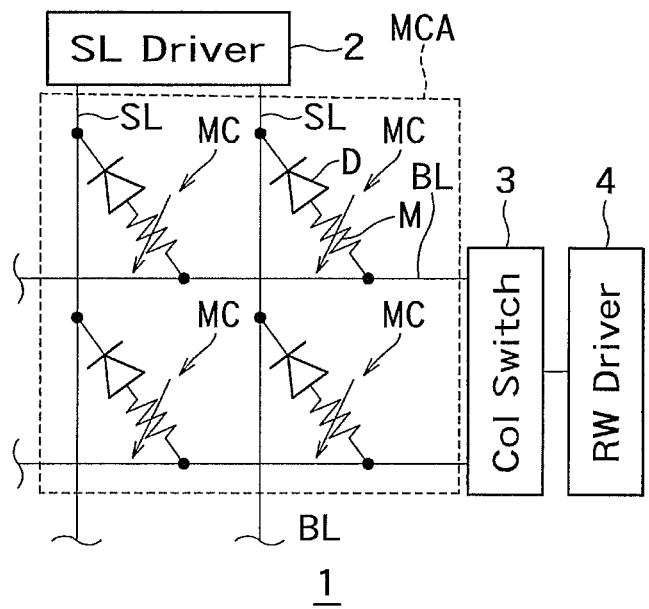
FIGS. 1 and 2 show examples of a configuration of an iPCM according to one embodiment.
Figure 2:
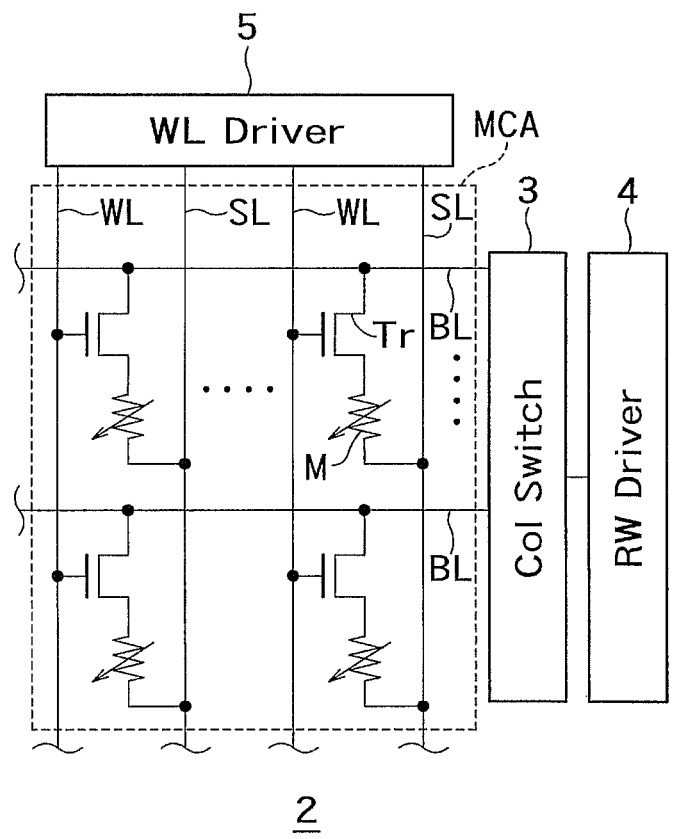

FIGS. 1 and 2 show examples of a configuration of an iPCM (hereinafter, also simply as "memory") according to one embodiment, respectively. The iPCM is a memory that stores data "1" or "0" in memory elements by transitioning the phase of each of the memory elements to bring the memory element to one of two states including a high-resistance state and a low-resistance state. The present embodiment is applicable to an arbitrary memory in which a memory layer is possibly formed on a lower electrode and is applicable, for example, a current detecting-type memory such as a ReRAM (Resistance Random Access Memory), a PRAM (Phase-change RAM), a PCM, a FeNAND (Ferroelectric NAND), or an MRAM (Magnetoresistive RAM), as well as the iPCM. Of course, the present embodiment can be applied to a memory other than the current detecting-type memory or to a device other than the memory.

A memory 1 shown in FIG. 1 is an example of a diode memory. Each of memory cells MC in a memory cell array MCA includes a memory element M and a diode D connected in series between one of bit lines BL and one of source lines SL. Each of the diodes D is connected to flow a current from the relevant bit line BL to the relevant source line SL. The source lines SL are connected to a source line driver 2. The bit lines BL are connected to a read/write driver 4 via a column switch 3. The source line driver 2 selectively drives the source lines SL. The column switch 3 can selectively connect any of the bit lines BL to the read/write driver 4. With this configuration, the memory 1 can flow a current to one of the memory cells MC selected by one of the source lines SL and one of the bit lines BL at the time of read or write.

A memory 2 shown in FIG. 2 is an example of a transistor memory. Each of memory cells MC includes a memory element M and a transistor Tr connected in series between one of bit lines BL and one of source lines SL. A gate of each of the transistors Tr is connected to one of word lines WL. The word lines WL are connected to a word line driver 5. The word line driver 5 thereby selectively drives one of the word lines WL. The source lines SL are fixed to a ground voltage. The bit lines BL are connected to the read/write driver 4 via the column switch 3. The read/write driver 4 thereby selectively drives one of the bit lines BL. With this configuration, the memory 2 can flow a current to one of the memory cells MC selected by one of the word lines WL and one of the bit lines BL at the time of read or write.

In this current detecting-type memory, it is preferable that a resistance difference between a high-resistance state and a low-resistance state produced by phase transition be large. To cause the resistance difference produced by phase transition to be large, it is important that crystals of a memory layer of the memory elements M have a favorable superlattice structure.

Figure 3:
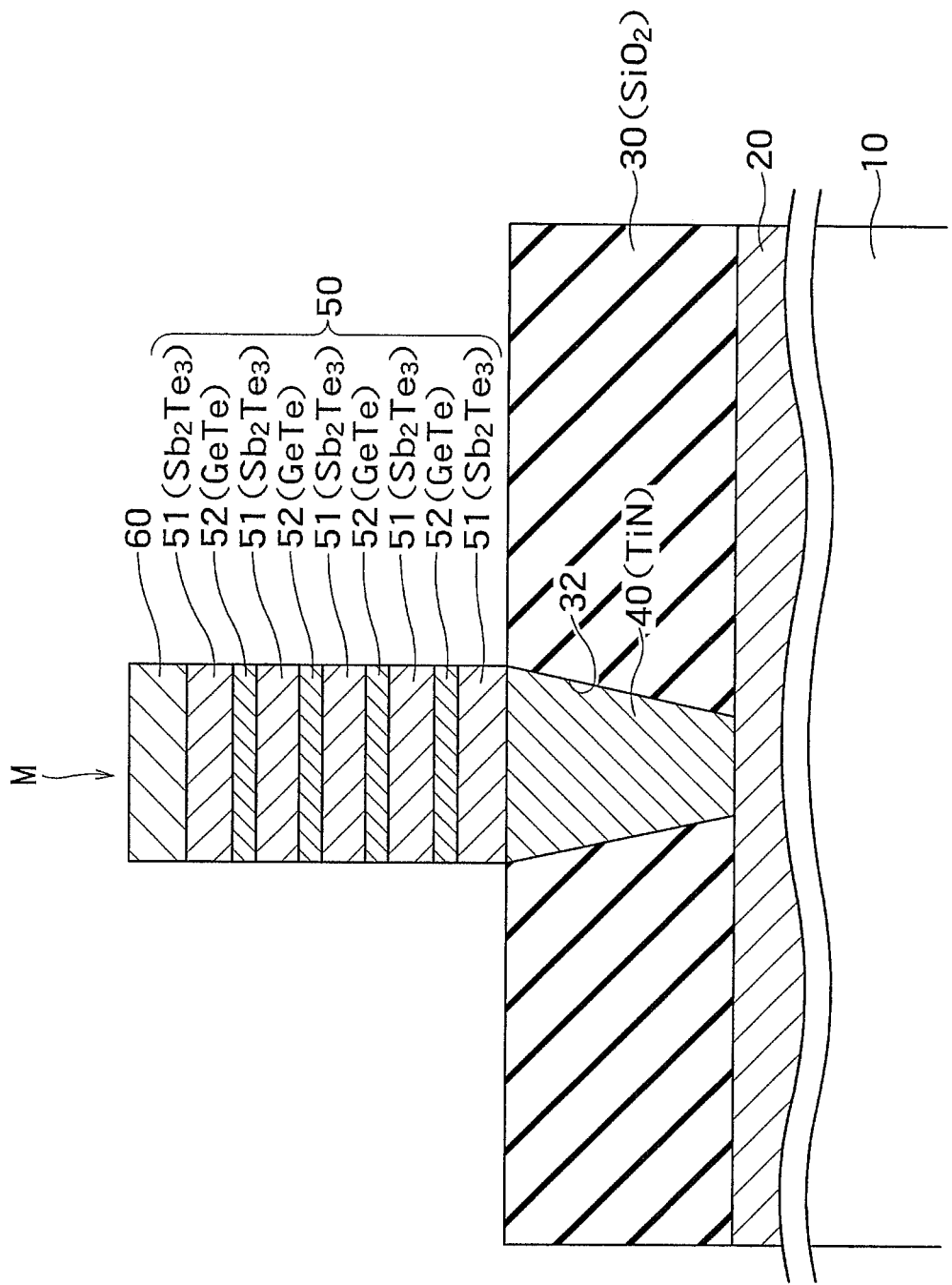
FIG. 3 is a cross-sectional view showing an example of a configuration of the memory element M according to the present embodiment.

FIG. 3 is a cross-sectional view showing an example of a configuration of the memory element M according to the present embodiment. The memory element M shown in FIG. 3 is applicable to any of the memories 1 and 2 shown in FIGS. 1 and 2, respectively.

The memory according to the present embodiment includes a substrate 10, a lower layer wiring 20, an interlayer dielectric film 30, a lower electrode 40, a memory layer 50, and an upper layer wiring 60.

The substrate 10 can be a semiconductor substrate such as a silicon substrate. Although not shown in FIG. 3, the diodes D or the transistors Tr shown in FIG. 1 or 2 and the like are formed on the substrate 10. Peripheral circuits that control the memory (such as the source line driver 2, the column switch 3, the read/write driver 4, and the word line driver 5) are also formed on the substrate 10.

The lower layer wiring 20 serving as a base layer is provided on an interlayer dielectric film (not shown) that covers the elements formed on the substrate 10. The lower layer wiring 20 is connected to, for example, the diodes D or the transistors Tr to form the memory cells M. The lower layer wiring 20 is made of, for example, a conductive metal such as copper or tungsten.

The interlayer dielectric film 30 serving as a material layer is provided on the lower layer wiring 20. The interlayer dielectric film 30 is made of, for example, an insulating film such as a silicon dioxide film. Via holes 32 are formed in the interlayer dielectric film 30 to reach the lower layer wiring 20.

The lower electrode 40 is filled in the via holes 32 and is electrically connected to the lower layer wiring 20. The lower electrode 40 is formed of a material such as TiN, VN, ZrN, NbN, HfN, or TaN. A configuration of the lower electrode 40 is explained later in detail.

The memory layer 50 serving as a phase-change material layer is provided on the lower electrode 40. The memory layer 50 is, for example, a stacked film including a plurality of recording layers 51 and 52. For example, the recording layers 51 and 52 are chalcogen compounds that both contain tellurium (Te) while having different compositions, respectively. The recording layers 51 are made of a phase-change material such as $Sb_2Te_3$ and the recording layers 52 are made of a phase-change material such as GeTe. The material of the recording layers 51 contains at least either antimony (Sb) or bismuth (Bi) in addition to tellurium. In the present embodiment, for example, $Sb_2Te_3$ containing antimony (Sb) is used as the material of the recording layers 51. Meanwhile, the material of the recording layers 52 contains atoms that reversibly move due to application of an electrical energy in addition to tellurium. As such atoms, any of germanium (Ge), aluminum (Al), gallium (Ga), indium (In), Tin (Sn), zinc (Zn), silver (Ag), gold (Au), and copper (Cu) can be used, for example. In the present embodiment, for example, GeTe containing germanium is used as the material of the recording layers 52. The memory layer 50 is formed by alternately stacking these recording layers 51 and 52. The memory layer 50 can cause phase transition to any of two states including a high-resistance state and a low-resistance state through a flow of a current between the lower electrode 40 and the upper layer wiring 60. The memory layer 50 can thereby function as a data recording layer.

The upper layer wiring 60 is provided on the memory layer 50. The upper layer wiring 60 is made of a conductive metal such as copper or tungsten as the lower layer wiring 20.

Although not shown, an interlayer dielectric film, contacts, a wiring, and the like are further provided on the upper layer wiring 60.

Figure 4:
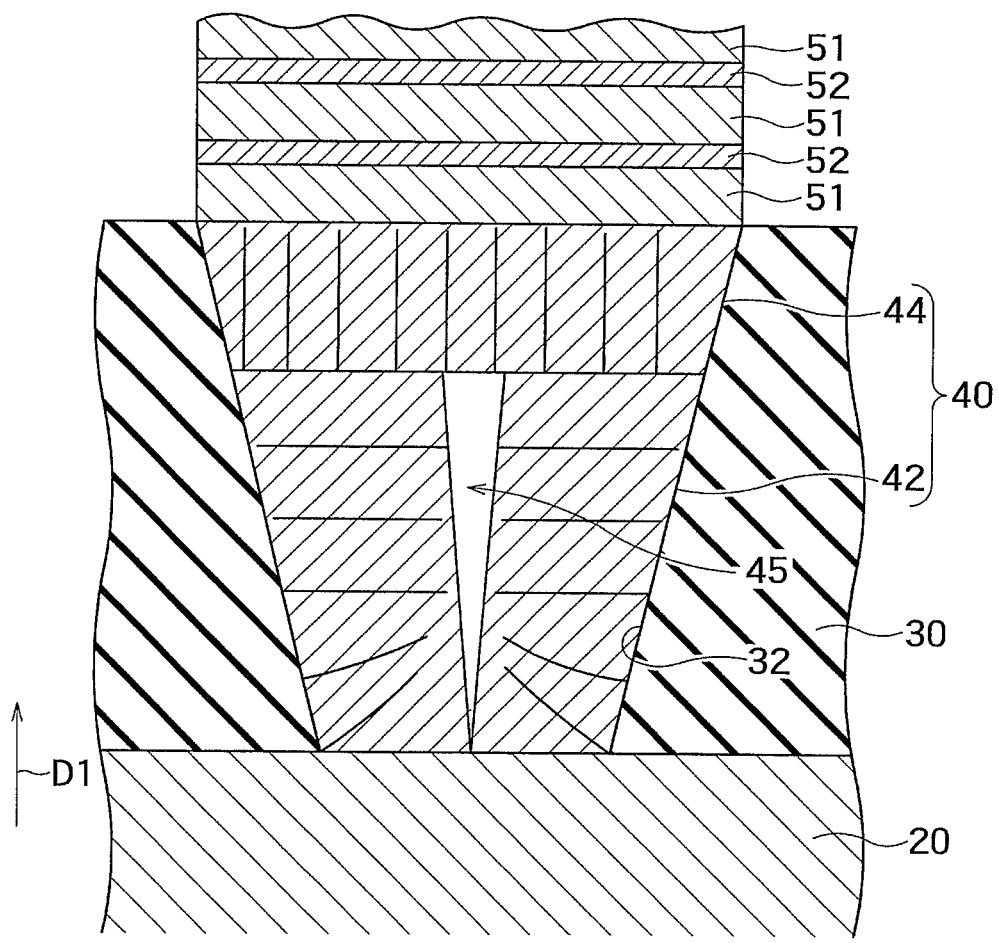
FIG. 4 is a cross-sectional view showing an example of a configuration of the lower electrode 40.

FIG. 4 is a cross-sectional view showing an example of a configuration of the lower electrode 40. The lower electrode 40 includes a lower layer portion 42 and an upper layer portion 44.

The lower layer portion 42 is provided in lower parts of the via holes 32 formed in the interlayer dielectric film 30 serving as the material layer. The lower layer portion 42 has a crystal structure in a direction not perpendicular to a surface of the lower layer wiring 20 serving as the base layer. A direction perpendicular to the surface of the lower layer wiring 20 is a D1 direction shown in FIG. 4. As described below, the material of the lower layer portion 42 is grown not only from the bottom surfaces of the via holes 32 (the surface of the lower layer wiring 20) but also from the side surfaces of the via holes 32 (the surface of the interlayer dielectric film 30) by a CVD (Chemical Vapor Deposition) method. The lower layer portion 42 can be thereby filled in the lower parts of the via holes 32. The lower layer portion 42 is, however, not so favorable in the crystal state and the flatness of the surface. Furthermore, because the lower layer portion 42 is grown also from the side surfaces of the via holes 32, there is a case where voids 45 are formed at central portions of the lower layer portion 42. While having the voids 45, the lower layer portion 42 is sufficiently filled in the via holes 32 and thus can be sufficiently electrically connected to the lower layer wiring 20.

The upper layer portion 44 is provided on the lower layer portion 42 in the via holes 32 and has a crystal structure in a direction substantially perpendicular to the surface of the lower layer wiring 20 (that is, the D1 direction). The material of the lower layer portion 44 is deposited on the surface of the lower layer portion 42 by a PVD (Physical Vapor Deposition) method as explained later. At that time, the material of the upper layer portion 44 is hardly deposited on the side surfaces of the via holes 32. For example, when the material of the upper layer portion 44 is deposited using a long throw sputter method of the PVD, the upper layer portion 44 can have a crystal structure in the D1 direction. The upper layer portion 44 is thereby formed on the lower layer portion 42 in the via holes 32 in a state where the crystal state and the flatness are favorable.

In this case, it is preferable that the materials of the lower layer portion 42 and the upper layer portion 44 (that is, the material of the lower electrode 40) can be deposited on the interlayer dielectric film 30 ($SiO_2$, for example) and have high out-of-plane orientations, respectively. The out-of-plane orientation indicates a regularity of a crystal orientation in the direction perpendicular to the substrate 10. Accordingly, the lower layer portion 42 can be embedded in the lower parts of the via holes 32. Furthermore, it is preferable that the materials of the lower layer portion 42 and the upper layer portion 44 be high-melting-point materials to prevent melting in thermal treatment of a manufacturing step. For example, melting points of the materials of the lower layer portion 42 and the upper layer portion 44 are equal to or higher than a film formation temperature of the iPCM and a temperature in a wiring formation step (about 400° C.) and are preferably about 1000° C. in consideration of practical process flexibility.

It is further preferable that the materials of the lower layer portion 42 and the upper layer portion 44 cause a C-axis orientation of the memory layer 50 to be the normal direction of the lower layer wiring 20 when the memory layer 50 is formed. For example, because a NaCl crystal has a (100) plane as the densest surface and has a 4-fold rotational symmetry, the NaCl crystal matches the C-axis orientation structure of the memory layer 50.

As described above, it is preferable that the materials of the lower layer portion 42 and the upper layer portion 44 be high-melting-point materials that can be formed on the interlayer dielectric film 30 and that have the NaCl crystal structure. For example, TiN, VN, ZrN, NbN, HfN, or TaN can be used as the materials of the lower layer portion 42 and the upper layer portion 44. The lower layer portion 42 and the upper layer portion 44 can be made of the same material or materials different from each other.

The recording layer 51 first formed on the lower electrode 40 (the lowermost recording layer 51) is used as a seed layer and defines the crystallinities and the flatnesses of other recording layers 51 and 52. Therefore, the crystallinity and the flatness of the lowermost recording layer 51 of the memory layer 50 are important for the memory property. In this case, as described above, the upper layer portion 44 of the lower electrode 40 has the crystal structure in the D1 direction and is favorable in the crystal state and in the flatness. Therefore, the lowermost recording layer 51 has crystals that can be oriented in a direction substantially perpendicular to the surface of the lower layer wiring 20 and also has a favorable flatness. That is, the lowermost recording layer 51 has a superlattice structure and can be flat on the surface.

When the lowermost recording layer 51 serving as a seed layer has a flat superlattice structure, the recording layers 51 and 52 grown thereon also have flat superlattice structures, respectively. In this way, the recording layers 51 and 52 are stacked to form a superlattice structure. A superlattice is a crystal lattice with a periodic structure that becomes longer than that of a basic unit lattice due to overlapping of plural kinds of crystal lattices. For example, in the recording layers 51 ($Sb_2Te_3$ layers), the C axes of hexagonal crystal systems are oriented in the layer stacking direction. The recording layers 52 (GeTe layers) are cubic crystal systems equivalent to the NaCl structure and layer stacking surfaces of the recording layers 52 (GeTe layers) with respect to the recording layers 51 ($Sb_2Te_3$ layers) are oriented in the (111) plane. These flat superlattice structures of the recording layers 51 and 52 provide a favorable memory property of the memory layer 50. The memory property includes a resistance difference produced by phase change, a leak current, a data retention, an endurance, and the like.

In the present embodiment, the lower electrode 40 is formed in the via holes 32 of a hole shape. However, the planar shape of the lower electrode 40 is not limited to the hole but can be a trench.

A manufacturing method of the memory according to the present embodiment is explained next.

FIGS. 5A to 5D are cross-sectional views showing a manufacturing method of the memory according to the present embodiment. The diodes D or the transistors Tr and the peripheral circuits are first formed on the substrate 10. An interlayer dielectric film and contacts (not shown) are then formed on the substrate 10 and then the lower layer wiring 20 serving as a base layer is formed on the interlayer dielectric film and the contacts. The lower layer wiring 20 is made of a conductive metal such as copper or tungsten as described above. The interlayer dielectric film 30 is then formed on the lower layer wiring 20. The interlayer dielectric film 30 is made of an insulating film such as a silicon dioxide film.

Figure 5A:
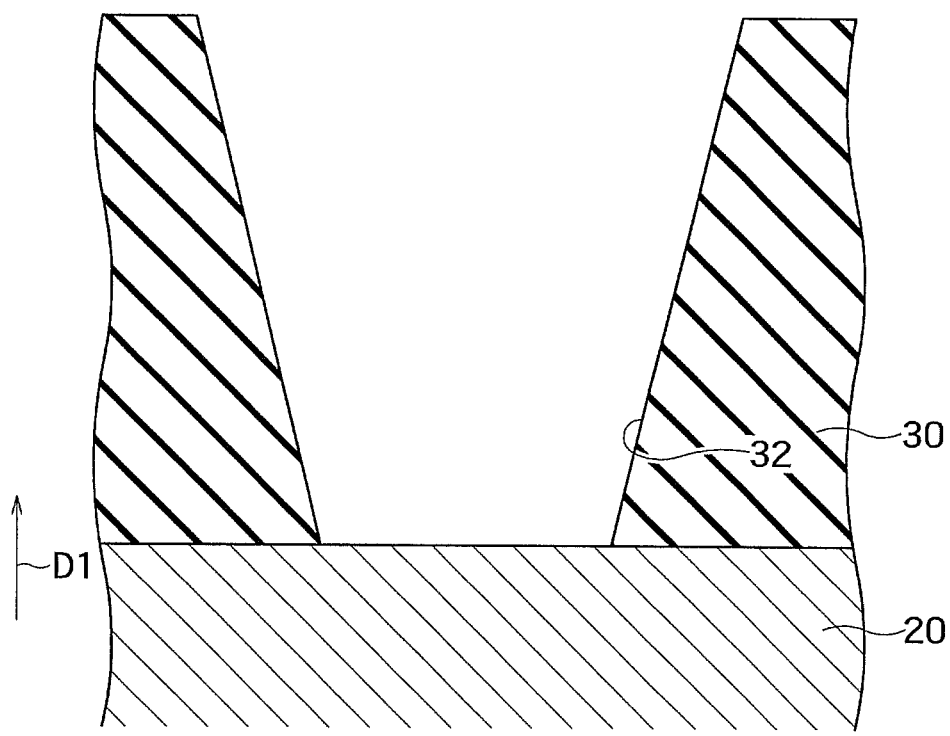
FIGS. 5A to 5D are cross-sectional views showing a manufacturing method of the memory according to the present embodiment.

The via holes 32 are then formed in the interlayer dielectric film 30 using a lithographic technique and an etching technique as shown in FIG. 5A. The planar shape of the via holes 32 can be a hole or a trench.

Figure 5B:
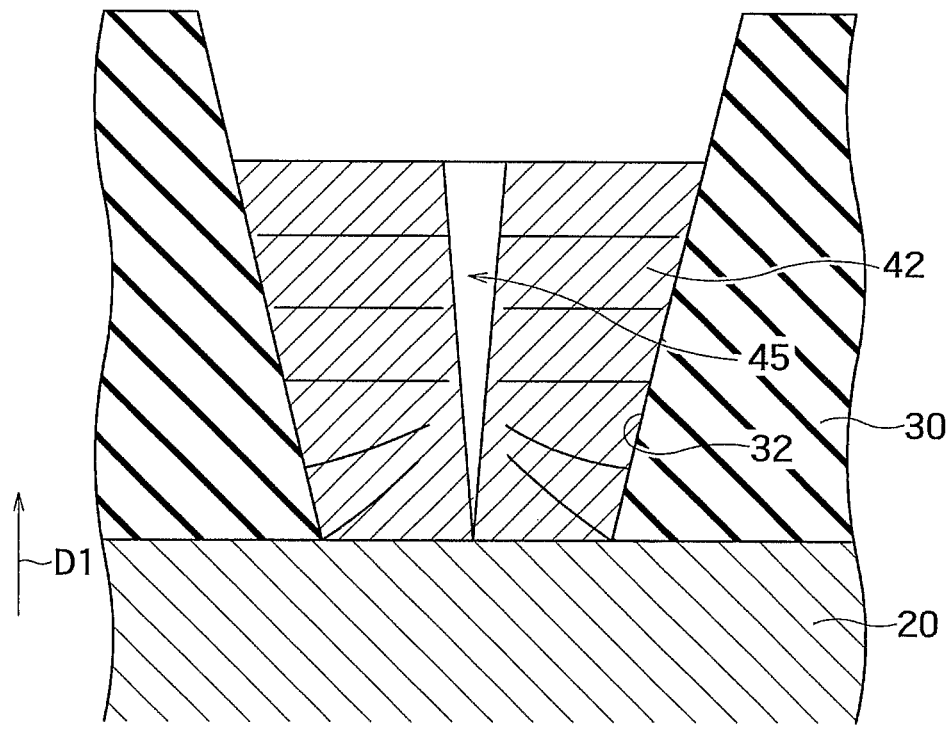

A material of the lower layer portion 42 is then embedded in the lower parts of the via holes 32 by the CVD method as shown in FIG. 5B. As described above, the material of the lower layer portion 42 is, for example, TiN, VN, ZrN, NbN, HfN, or TaN. The material of the lower layer portion 42 is deposited by the CVD method to be grown not only from the bottom surfaces of the via holes 32 (the surface of the lower layer wiring 20) but also from the side surfaces of the via holes 32 (the surface of the interlayer dielectric film 30). Therefore, the material of the lower layer portion 42 can be filled in the lower parts of the via holes 32. The lower layer portion 42 is, however, not favorable in the crystal state and the flatness of the surface. Furthermore, because the lower layer portion 42 is grown from the side surfaces of the via holes 32, the voids 45 are formed at central portions of the lower layer portion 42.

Figure 5C:
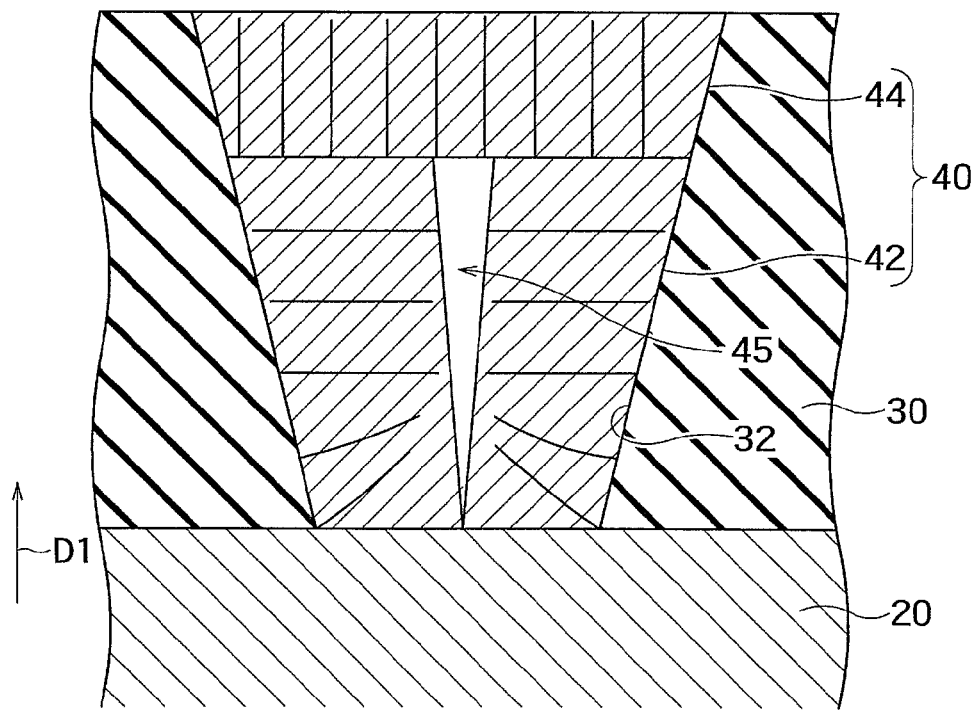

A material of the upper layer portion 44 is then grown on the lower layer portion 42 by the PVD method as shown in FIG. 5C. That is, the material of the upper layer portion 44 is embedded in upper parts of the via holes 32. At that time, the material of the upper layer portion 44 is deposited, for example, by the long throw sputter method of the PVD. In the long throw sputter method, the distance between a target and the substrate 10 is set relatively long, whereby deposition in a direction inclined from the D1 direction is suppressed while deposition in the D1 direction is kept. Accordingly, while the material of the upper layer portion 44 is deposited on the lower layer portion 42, the material of the upper layer portion 44 is hardly deposited on the side surfaces of the via holes 32. The lower layer portion 42 formed by CVD sputtering before PVD sputtering is performed can be etched back by RIE (Reactive Ion Etching) or wet etching. This ensures the depths of small ones of the via holes 32 (narrower ones of trenches) and can accurately embed the material of the upper layer portion 44 by the PVD sputtering.

Furthermore, the material of the upper layer portion 44 has the NaCl crystal structure. For example, the material of the upper layer portion 44 is TiN, VN, ZrN, NbN, HfN, or TaN as described above. By depositing such a material by the PVD long throw sputter method, the upper layer portion 44 has a crystal structure in the D1 direction and is formed in a state being favorable in the flatness. The material of the upper layer portion 44 is then polished by CMP (Chemical Mechanical Polishing) to be flattened. Parts of the material of the upper layer portion 44 other than those embedded in the via holes 32 (or the trenches) are thereby removed to form the upper layer portion 44. The CMP step ensures the flatnesses of the surface of the interlayer dielectric film 30 and the surface of the upper layer portion 44 embedded in the via holes 32 (or the trenches). Besides, the crystal orientations of the surface of the upper layer portion 44 in the via holes 32 (or the trenches) can be aligned in the same direction (the D1 direction).

Figure 5D:
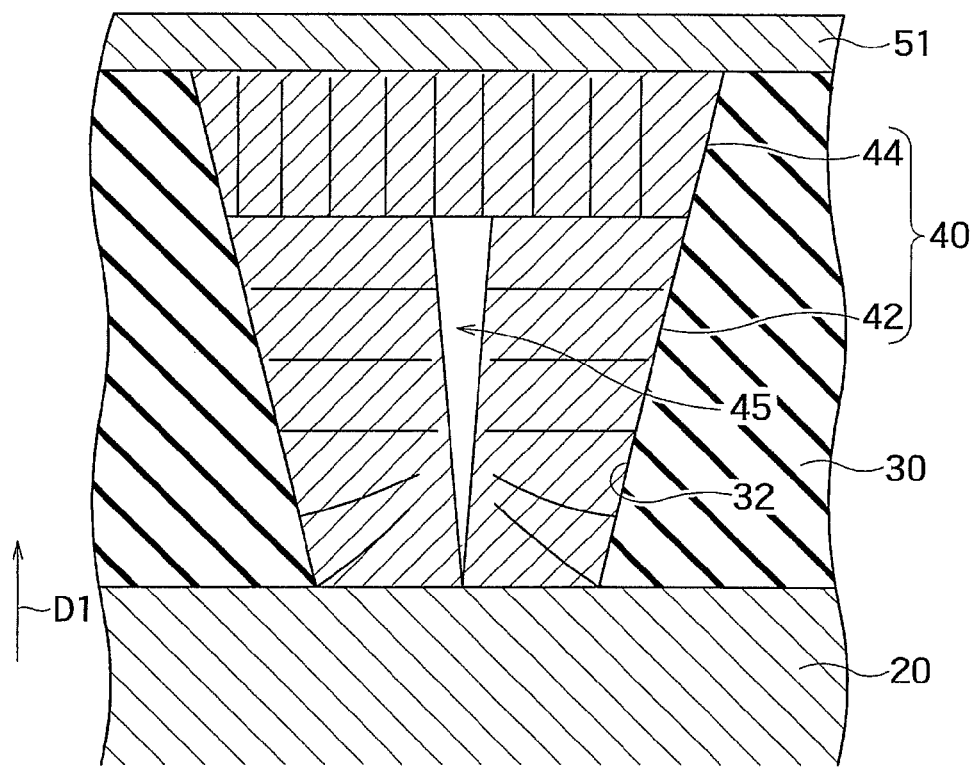

The lowermost recording layer 51 is then deposited on the upper layer portion 44 as shown in FIG. 5D. As described above, the upper layer portion 44 of the lower electrode 40 has the crystal structure in the D1 direction and is favorable in the crystal state and the flatness. Therefore, the lowermost recording layer 51 has crystals that can be oriented in a direction substantially perpendicular to the surface of the lower layer wiring 20 and is favorable in the flatness. That is, the lowermost recording layer 51 has a flat superlattice structure.

One of the recording layers 52 is then formed on the lowermost recording layer 51. Other recording layers 51 and 52 are stacked on the recording layer 52. The recording layers 51 and 52 are then processed by the lithographic technique and the RIE method. The memory layer 50 as shown in FIG. 4 is thereby formed.

Because the lowermost recording layer 51 has a flat superlattice structure, other recording layers 51 and 52 grown thereon also have flat superlattice structures. Accordingly, the memory layer 50 has a favorable memory property.

An interlayer dielectric film, contacts, a wiring, and the like (not shown) are then further formed, whereby the memory according to the present embodiment is completed.

In the present embodiment, the lower layer portion 42 of the lower electrode 40 is formed by the CVD method. Therefore, the lower layer portion 42 can be filled in the lower parts of the via holes 32 to be electrically connected to the lower layer wiring 20. The upper layer portion 44 of the lower electrode 40 is formed by the PVD method. Therefore, the upper layer portion 44 can be formed in the via holes 32 in a state where the crystal state and the flatness are favorable.

Because the upper layer portion 44 is favorable in the crystal state and the flatness, the lowermost recording layer 51 has a flat superlattice structure. Because the lowermost recording layer 51 serving as a seed layer has a flat superlattice structure, the recording layers 51 and 52 grown thereon also have flat superlattice structures.

If the crystallinity and the flatness of the upper layer portion 44 are poor, there is a case where the memory layer 50 does not have a superlattice structure and becomes an amorphous, metal crystals with a disordered orientation, or a structure in which three states (a superlattice structure, an amorphous, and metal crystals with a disordered orientation) are mixed. In this case, not only a resistance difference produced by phase change is reduced but also a leak current is increased and thus the function of the memory is lost.

On the other hand, according to the present embodiment, the memory property of the memory layer 50 becomes favorable, the resistance difference produced by phase change becomes large, and the leak current becomes small. As a result, the data retention and the endurance of the memory can be also improved.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a base layer;
an interlayer dielectric film provided directly on the base layer;
a lower layer portion provided in lower parts of trenches or holes in the interlayer dielectric film and having a crystal structure in a direction not perpendicular to a surface of the base layer; and
an upper layer portion provided on the lower layer portion in the trenches or the holes and having a crystal structure in a direction substantially perpendicular to the surface of the base layer.

2. The device of claim 1, further comprising a phase-change material layer provided on the upper layer portion and having crystals oriented in a direction substantially perpendicular to the surface of the base layer.

3. The device of claim 2, wherein the phase-change material layer is a chalcogen compound containing tellurium (Te).

4. The device of claim 2, wherein the phase-change material layer contains at least antimony (Sb) or bismuth (Bi) in addition to tellurium (Te).

5. The device of claim 2, wherein the phase-change material layer contains atoms reversibly moving due to application of an electrical energy in addition to tellurium (Te).

6. The device of claim 2, wherein the phase-change material layer is a stacked film including $Sb_2Te_3$ layers and GeTe layers alternately stacked.

7. The device of claim 2, wherein the phase-change material layer has a superlattice structure.

8. The device of claim 2, wherein the phase-change material layer is a data recording layer of an iPCM.

9. The device of claim 1, wherein a material of the lower layer portion or the upper layer portion has an out-of-plane orientation being capable of film formation on the interlayer dielectric film and has a type of a NaCl crystal.

10. The device of claim 8, wherein a material of the lower layer portion or the upper layer portion is any of TiN, VN, ZrN, NbN, HfN, and TaN.

11. The device of claim 8, wherein:
the base layer is a wiring layer above a substrate, and
the lower layer portion and the upper layer portion are contacts embedded in contact holes in the interlayer dielectric film.

12. The device of claim 1, wherein inner walls of the trenches or holes are tapered in a direction perpendicular to the surface of the base layer such that a distance between the inner walls at a bottom side of the trenches or holes is smaller than a distance between the inner walls at a top side of the trenches or holes.

* * * * *